United States Patent
Sugg

(10) Patent No.: US 7,271,524 B2
(45) Date of Patent: Sep. 18, 2007

(54) PIEZO ACTUATOR

(75) Inventor: Bertram Sugg, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/524,788

(22) PCT Filed: Jun. 3, 2003

(86) PCT No.: PCT/DE03/01810

§ 371 (c)(1),
(2), (4) Date: Aug. 22, 2005

(87) PCT Pub. No.: WO2004/019425

PCT Pub. Date: Mar. 4, 2004

(65) Prior Publication Data

US 2006/0108898 A1    May 25, 2006

(30) Foreign Application Priority Data

Aug. 16, 2002 (DE) ............... 102 37 589

(51) Int. Cl.
*H01L 41/083* (2006.01)
(52) U.S. Cl. ...................................... 310/328
(58) Field of Classification Search ............ 310/328; 73/24

See application file for complete search history.

(56) References Cited

U.S. PATENT DOCUMENTS 5,126,618 A  6/1992 Takahashi et al.

2002/0084872 A1*  7/2002  Kawazoe ............. 310/328
2003/0001463 A1*  1/2003  Bindig et al. ......... 310/366

FOREIGN PATENT DOCUMENTS

| DE | 41 07 158 A1 | 9/1991 |
| DE | 197 53 930 A1 | 6/1999 |
| DE | 199 28 178 A1 | 8/2000 |
| DE | 100 25 998 A1 | 12/2001 |
| EP | 0 603 835 A1 | 6/1994 |
| JP | 10044439 A * | 2/1998 |
| JP | 11121820 A * | 4/1999 |
| WO | WO 01/91198 A1 | 11/2001 |

* cited by examiner

*Primary Examiner*—J. San Martin
(74) *Attorney, Agent, or Firm*—Ronald E. Greigg

(57) ABSTRACT

A piezoelectric actuator for actuating a mechanical component in which the piezoelectric actuator is provided with a multilayer construction of piezoelectric layers and can be acted upon by an electrical voltage in a piezoelectrically active region via inner electrodes disposed between the layers. At least one inactive region is present in the layer construction of the piezoelectric actuator, and this region is formed without inner electrodes, of a material whose mechanical and thermal properties match the properties of the active region, including the combination and the interaction of the material of the piezoelectric layers and of the inner electrodes.

1 Claim, 1 Drawing Sheet

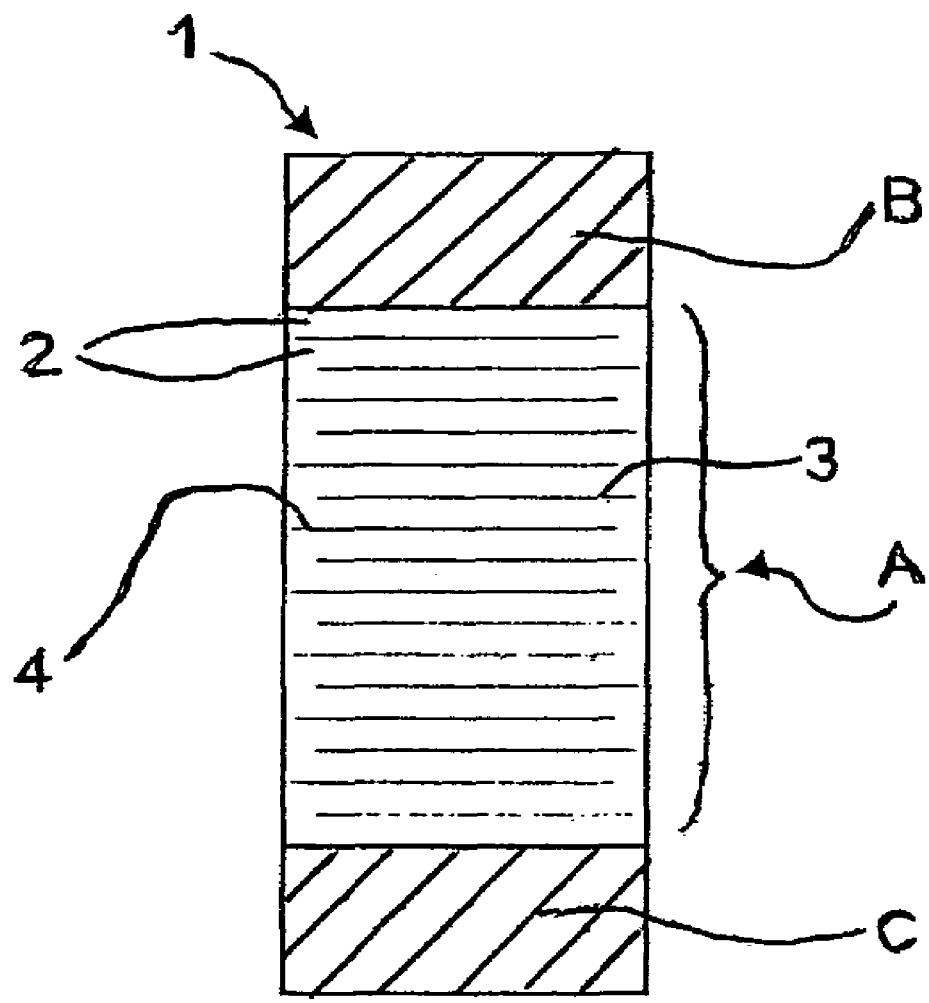

PIEZO ACTUATOR

CROSS-REFERENCE TO RELATED APPLICATIONS

This application is a 35 USC 371 application of PCT/DE 03/01810 filed on Jun. 3, 2003.

BACKGROUND OF THE INVENTION

1. Field of the Invention

The invention relates to a piezoelectric actuator, for instance for actuating a mechanical component such as a valve or the like.

2. Description of the Prior Art

It is widely known that by using what is known as the piezoelectric effect, a piezoelectric element may be constructed from a material that has a suitable crystal structure. When an external electrical voltage is applied to these piezoelectric and electrostrictive ceramics, a mechanical reaction of the piezoelectric element ensues, which as a function of the crystal structure and the regions where the electrical voltage is applied represents a pressure or tension in a predeterminable direction.

Because of the extremely fast and precisely regulatable reciprocation effect, such piezoelectric actuators may be contemplated for constructing final control elements, for instance for driving switching valves in fuel injection systems in motor vehicles. The voltage- or charge-controlled deflection of the piezoelectric actuator is utilized for positioning a control valve, which in turn regulates the stroke of a nozzle needle.

Since the required electrical field intensities for actuating the piezoelectric actuator are in the range of several kV/mm, and as a rule moderate electrical voltages for triggering are desired, the construction of this piezoelectric actuator is done here in multiple layers of metallized piezoceramics, stacked one above the other, to form what is known as a multilayer actuator. To that end, between each of the layers there are inner electrodes, applied for instance by a printing process, and there are also outer electrodes by way of which the electrical voltage is applied. One typical method for producing such layers is film casting. To produce the inner electrodes, the individual layers are metallized and stacked one above the other, and then between two layers, with inner electrodes of different polarity, the piezoelectric effect develops.

At the top and bottom regions, however, the inner electrodes as a rule are missing, since on the one hand, a certain insulation distance is needed at the end faces, to avoid short circuits toward the outside, and on the other, passive zones are utilized for electrical connection of the outer electrodes. Passive regions may also be present inside the actuator. Often, however, in the zone between the region with inner electrodes, as an active zone, and the region without inner electrodes, as a passive zone, there is the risk of cracks. This phenomenon shortens the service life and can lead to the total failure of the actuator.

It is known per se from German Patent Disclosure DE 100 25 998 A1 that passive regions of variable length are disposed on both ends of the ply or layer construction. A total length of the piezoelectric actuator fixedly defined for a particular installation situation is attained here by way of reducing the length of the piezoelectrically inactive top and/or bottom piece, for instance by hard machining by means of grinding or the like.

In this known piezoelectric actuator, on the one hand, the passive layers may be of the same ceramic material as the active region, but with outer electrodes that are contacted electrically on only one side or not at all, so that the inactive regions are also penetrated by the metal layers of the inner electrodes. On the other hand, the respective inactive region may also be a completely electrically insulated metal or ceramic block, which can simply be glued to the piezoelectrically active region, for instance.

SUMMARY AND ADVANTAGES OF THE INVENTION

The piezoelectric actuator described above as noted, consists of a multilayer construction of piezoelectric layers and in a piezoelectrically active region with inner electrodes located between the layers and is provided with contacting of the inner electrodes that alternates from layer to layer, for subjecting it to an electrical voltage. There is moreover at least one inactive region, such as a bottom and/or top part, on one end or even inside the active region, in the total installed length in the layer construction of the piezoelectric actuator.

Advantageously, the piezoelectric actuator of the invention, in at least one inactive region without inner electrodes, is formed of a material whose mechanical and thermal properties match the properties of the active region, including the combination and interaction of the material comprising the piezoelectric layers and the inner electrodes. Examples of matching mechanical and thermal properties of the piezoelectric layers of the inactive region and of the active region that can be considered are the thermal expansion, the elasticity, and the shrinkage upon sintering of the multilayer construction of the piezoelectric actuator.

In an especially advantageous embodiment, in the piezoelectric actuator of the invention, the inactive regions and the active region are made from an identical ceramic basic substance, with additional dopants inserted into the inactive regions. Preferably, the basic substance is lead zirconate titanate (PZT), and the dopant is silver. Silver is advantageous in the sense that it is often incorporated into the active region, and the inner electrodes are therefore preferably constructed of AgPd, so that when additional doping with silver is done in the passive region, similar properties are obtained.

With the invention, it is advantageously possible in particular to minimize the tendency of cracking in piezoelectric stacked actuators at the transition from active to inactive regions. This is accomplished primarily in the production process, which directly minimizes the failure rate. A primary cause of cracking here is that in sintering of the piezoelectric actuator, the ceramic in the region having the inner electrodes shrinks to a different extent than in the region without inner electrodes. This is associated with the fact that chemical elements of the inner electrode diffuse into the ceramic and dope it and thus change the shrinkage properties. The shrinkage mismatch then leads to the damaging mechanical stresses.

The arrangement according to the invention moreover, however, promotes reliability during the operation of the piezoelectric actuator. In operation of the actuator, it expands in the active region because of the longitudinal effect ($d_{33}$ effect) in the longitudinal direction. Simultaneously, however, a transverse contraction occurs ($d_{31}$ effect). Since in the passive region the ceramic remains rigid, this difference in expansion also leads to mechanical stresses.

Moreover, the coefficient of thermal expansion differs between the active and the passive region, because of the influence of the metal of the inner electrodes in the active region, so that mechanical stresses also occur upon temperature changes. Thus the advantage of the invention is above all that in the region between the active and inactive regions, the mechanical stresses are minimized, and all the causes mentioned above are taken into account in order to avoid cracking.

BRIEF DESCRIPTION OF THE DRAWINGS

One exemplary embodiment of the piezoelectric actuator of the invention is described herein below in conjunction with the sole figure of the drawing, which shows a section through a piezoelectric actuator with a multilayer construction made up of layers of piezoceramic and of active and inactive regions.

DESCRIPTION OF THE PREFERRED EMBODIMENTS

In the drawing, a piezoelectric actuator 1 is shown, which in a manner known per se is constructed of piezoelectric layers 2 of a ceramic material, for instance so-called green films, with a suitable crystal structure, so that by utilizing what is known as the piezoelectric effect, when an external electrical direct voltage is applied to the inner electrodes 3 and 4, via externally contacted electrodes not identified by reference numeral here, a mechanical reaction of the piezoelectric actuator 1 ensues.

The piezoelectric actuator 1 is subdivided into a piezoelectrically active region A and two inactive or passive regions B and C mounted on the top and bottom ends, respectively. In this context, a region is called active that is penetrated by alternating polarity from the inner electrodes 3 and 4 and in the final analysis thus contributes to the total longitudinal expansion, which is wanted for operation, of the piezoelectric actuator 1.

In the exemplary embodiment of the invention, the multilayer piezoelectric actuator 1 is constructed in such a way that the composition of the material of the ceramic layers differs in the active region A from the passive regions B and C. The difference is designed such that then, taking into account the combination and interaction of the material of the piezoelectric layers and of the inner electrodes in the region A, the mechanical and thermal properties of the layers of the inactive region B, C and of the active region A, and in particular the thermal expansion, the elasticity, and the shrinkage upon sintering of the multilayer construction of the piezoelectric actuator, are compatible.

Thus for producing the green films, intrinsically two types of ceramic are necessary. These may for example be types of ceramic that are prepared differently, for instance on the basis of lead zirconate titanate (PZT). This or other ceramics on a commonly based basic substance can be varied and adapted accordingly by adding suitable dopants, such as silver.

The ceramic of the respective passive region B, C is compounded in such a way that the properties with respect to shrinkage upon sintering, thermal expansion, and elasticity are ideally compatible with the ceramic of the active region A, in combination with the inner electrodes and the resultant interaction.

Thus from these two ceramics, two types of green film can be produced, and in stacking to form the so-called green body of the piezoelectric actuator 1, films of the type for the region B and the region C may then be used for the top and bottom regions B and C and optionally intermediate regions, not shown here. For the active region or regions, green films for the active region A are used; in that case, these green or ceramic films need merely be metallized in order to produce the inner electrodes.

The foregoing relates to a preferred exemplary embodiment of the invention, it being understood that other variants and embodiments thereof are possible within the spirit and scope of the invention, the latter being defined by the appended claims.

The invention claimed is:

1. In a piezoelectric actuator, comprising
a multilayer construction of piezoelectric layers (2) and inner electrodes (3, 4), which are located in a piezoelectrically active region (A) between the layers and can be acted upon by an electrical voltage, and
at least one inactive region (B, C) without inner electrodes in the layer construction of the piezoelectric actuator (1), the improvement wherein
the at least one inactive region (B, C) without inner electrodes is formed of a material whose mechanical and thermal properties, including shrinkage upon sintering of the multilayer construction of the piezoelectric actuator (1), match the mechanical and thermal properties of the active region (A), including the combination and interaction of the material comprising the piezoelectric layers (2) and the inner electrodes (3, 4), wherein the inactive regions (B, C) and the active region (A) are made from an identical ceramic basic substance, with additional dopants inserted into the inactive regions (B, C), wherein the basic substance is lead zirconate titanate (PZT), and the dopant is silver, and wherein the matching mechanical and thermal properties of the piezoelectric layers (2) of the inactive region (B, C) and of the active region (A), include thermal expansion and elasticity.

* * * * *

UNITED STATES PATENT AND TRADEMARK OFFICE
CERTIFICATE OF CORRECTION

| | | |
|---|---|---|
| PATENT NO. | : 7,271,524 B2 | |
| APPLICATION NO. | : 10/524788 | |
| DATED | : September 18, 2007 | |
| INVENTOR(S) | : Bertram Sugg | |

It is certified that error appears in the above-identified patent and that said Letters Patent is hereby corrected as shown below:

Title page,

Item (54) should read as follows:

(54)    PIEZOELECTRIC ACTUATOR

Signed and Sealed this

Twentieth Day of November, 2007

JON W. DUDAS
*Director of the United States Patent and Trademark Office*